(12) United States Patent
Fung (10) Patent No.: US 9,943,015 B2
(45) Date of Patent: Apr. 10, 2018

(54) ASSEMBLY STRUCTURE OF HIGH-POWER SEMICONDUCTORS AND HEAT SINK

(71) Applicant: Man Piu Fung, Hong Kong (HK)

(72) Inventor: Man Piu Fung, Hong Kong (HK)

( * ) Notice: Subject to any disclaimer, the term of this patent is extended or adjusted under 35 U.S.C. 154(b) by 0 days.

(21) Appl. No.: 15/236,505

(22) Filed: Aug. 15, 2016

(65) Prior Publication Data

US 2017/0055364 A1 Feb. 23, 2017

(30) Foreign Application Priority Data

Aug. 17, 2015 (HK) .................................. 15107928.5

(51) Int. Cl.
H05K 7/20 (2006.01)
H05K 1/14 (2006.01)
H02P 29/68 (2016.01)
H02P 27/06 (2006.01)

(52) U.S. Cl.
CPC .............. *H05K 7/209* (2013.01); *H02P 29/68* (2016.02); *H05K 1/144* (2013.01); *H02P 27/06* (2013.01); *H05K 2201/042* (2013.01); *H05K 2201/066* (2013.01)

(58) Field of Classification Search
CPC ............ H05K 7/20; H05K 1/144; H05K 1/14; H05K 7/209; H02P 29/69
USPC ....................................................... 361/721
See application file for complete search history.

(56) References Cited

U.S. PATENT DOCUMENTS

| | | | |
|---|---|---|---|
| 3,766,439 A * | 10/1973 | Isaacson | H05K 1/189 174/252 |
| 7,142,428 B2 | 11/2006 | Vackar | |
| 7,460,373 B2 * | 12/2008 | Nagahashi | H01L 23/3672 165/185 |
| 7,561,436 B2 | 7/2009 | Brandenburg et al. | |
| 7,589,970 B2 | 9/2009 | Hsieh | |
| 7,902,464 B2 | 3/2011 | Danjo et al. | |
| 9,437,518 B2 * | 9/2016 | Byun | H01L 23/367 |

(Continued)

FOREIGN PATENT DOCUMENTS

| | | |
|---|---|---|
| CN | 1239327 A | 12/1999 |
| CN | 201163755 Y | 12/2008 |
| JP | 5020212 B2 | 9/2012 |

OTHER PUBLICATIONS

Search Report issued by the Chinese Patent Office dated May 4, 2014.

(Continued)

*Primary Examiner* — Dion R Ferguson
*Assistant Examiner* — Mandeep S Buttar (57) ABSTRACT

An assembly structure of high-power semiconductors and heat sink includes a high-power semiconductor module and a heat sink. The high-power semiconductor module includes a printed circuit board, and high-power semiconductor components provided on the surfaces of the printed circuit board. The heat sink includes at least two primary heat-dissipating fins. The high-power semiconductor module is disposed between two adjacent primary heat-dissipating fins. A plurality of gap-filling layers are provided between the high-power semiconductor module and the primary heat-dissipating fins, and the gap-filling layers are tightly fitted on surfaces of the primary heat-dissipating fins.

14 Claims, 6 Drawing Sheets

(56) References Cited

U.S. PATENT DOCUMENTS

2009/0237883 A1* 9/2009 Wei .......................... G06F 1/20
                                                    361/699
2013/0119908 A1* 5/2013 Harada .................... H02P 6/10
                                                    318/400.42

OTHER PUBLICATIONS

Search Report of counterpart Hong Kong Short-term Patent Application No. 15107928.5 dated Sep. 18, 2015.

* cited by examiner

ASSEMBLY STRUCTURE OF HIGH-POWER SEMICONDUCTORS AND HEAT SINK

CROSS-REFERENCE TO RELATED APPLICATIONS

This application claims the benefit of Hong Kong Short-Term Patent Application No. 15107928.5, filed Aug. 17, 2015, the entire content of which is hereby incorporated by reference.

FIELD OF THE TECHNOLOGY

The present patent application relates to an assembly structure of power semiconductor and heat sink, and particularly to an assembly structure of high-power semiconductors and heat sink.

BACKGROUND

When high-power semiconductor components are running, they will generate heat loss. If the amount of heat generation is too much and too late to dissipate into surrounding media, the semiconductor components will fail to operate due to overheating. To avoid overheating of high-power semiconductor components, heat sinks will usually be added to increase heat dissipation. However, with the increase of power density, heat generated by high-power semiconductor components increases. Existing assembly structures of high-power semiconductors and heat sinks are difficult to meet the need of heat dissipation, and a more effective heat-dissipating structure is needed badly.

SUMMARY

An object of the present patent application is to provide an assembly structure of high-power semiconductors and heat sink to timely dissipate heat generated by the high-power semiconductor components so as to avoid the affect of normal operation of the high-power semiconductor components due to overheating.

According to one aspect, there is provided an assembly structure of high-power semiconductors and heat sink which may include first and second high-power semiconductor modules and a heat sink. The first high-power semiconductor module may include a first printed circuit board, and a first plurality of high-power semiconductor components is provided on a first surface of the first printed circuit board. The second high-power semiconductor module may include a second printed circuit board, and a second plurality of high-power semiconductor components is provided on a first surface of the second printed circuit board. The heat sink may include at least three primary heat-dissipating fins. The first high-power semiconductor module and the second high-power semiconductor module may be disposed between two adjacent primary heat-dissipating fins respectively. A plurality of gap-filling layers may be provided between the first high-power semiconductor module and the primary heat-dissipating fins, as well as between the second high-power semiconductor module and the primary heat-dissipating fins. The gap-filling layers can be tightly fitted on surfaces of the primary heat-dissipating fins.

According to another aspect, there is provided an assembly structure of high-power semiconductors and heat sink which may include a high-power semiconductor module and a heat sink. The high-power semiconductor module may include a printed circuit board, and first and second pluralities of high-power semiconductor components provided on first and second surfaces of the printed circuit board respectively. The heat sink may include at least two primary heat-dissipating fins. The high-power semiconductor module can be disposed between two adjacent primary heat-dissipating fins. A gap-filling layer may be provided between the high-power semiconductor module and the primary heat-dissipating fins. The gap-filling layer can be tightly fitted on surfaces of the primary heat-dissipating fins.

In one embodiment, the high-power semiconductor components may be surface mount semiconductors.

In one embodiment, the high-power semiconductor components may be mounted on the printed circuit boards by means of surface mounting technology.

In one embodiment, each printed circuit board may be provided with at least one connector or connecting aperture for electrical connection.

In one embodiment, the gap-filling layers may possess heat conductivity and flexibility.

In one embodiment, the gap-filling layers may cover the high-power semiconductor modules.

In one embodiment, the heat sink may be made from a piece of metal, or a combination of two or more pieces of metal.

In one embodiment, a plurality of heat-conductive metal plates may be horizontally fixed on top portion of packagings of the high-power semiconductor components. The heat-conductive metal plates can be electrically connected with large current-flowing pins of the high-power semiconductor components.

The implementation of the assembly structure of high-power semiconductors and heat sink of the present patent application has the following beneficial effects.

In the present patent application, since accommodating space is formed when high-power semiconductor modules are disposed between the primary heat-dissipating fins of the heat sink, and gap-filling layers are provided between the high-power semiconductor modules and the primary heat-dissipating fins, heat generated by the high-power semiconductor modules can quickly be conducted to the heat-dissipating fins of the heat sink and can spread out quickly through the primary heat-dissipating fins.

BRIEF DESCRIPTION OF THE DRAWINGS

Specific embodiments of the present patent application will now be described by way of example with reference to the accompanying drawings wherein.

DETAILED DESCRIPTION

To have a clear understanding of the technical features, objects and effects of the assembly structure of high-power semiconductors and heat sink of the present patent application, specific embodiments will now be described in detail with reference to the accompanying drawings.

Embodiments of the assembly structure of high-power semiconductors and heat sink of the present patent application are described below in detail. These embodiments are shown in the accompanying drawings. Like reference numerals representing like parts are used throughout the drawings.

It should be appreciated that in the description of the assembly structure of high-power semiconductors and heat sink of the present patent application, the terms "front", "rear", "top", "bottom", "upper end", "lower end", top portion", "bottom portion", etc. refer to the orientation or position of a structure as it is oriented and positioned in the drawings. Those terms are used to simplify the description and do not indicate or imply that the structure must have a specific orientation or operate in a specific position. Those terms should not be considered as limiting. As used herein, the terms "first", and "second" etc. are merely used to differentiate features to be described, and are not meant to indicate or imply the relative importance of the features.

Figure 1:
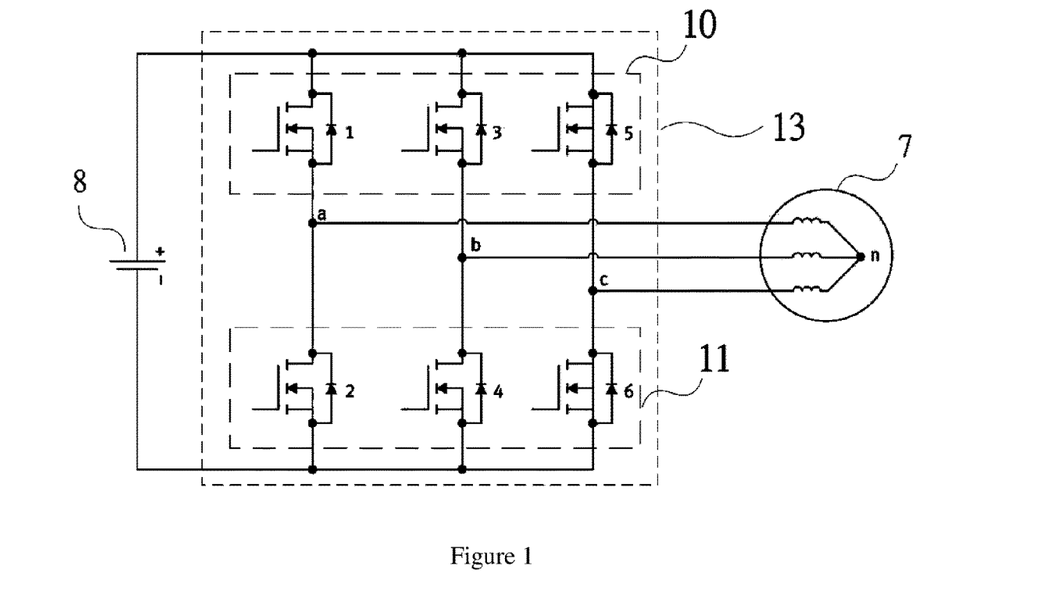
FIG. 1 is an illustrative diagram of a driving circuit of a three-phase brushless motor.

FIG. 1 is an illustrative diagram of a common three-phase brushless motor driving circuit. The three-phase brushless motor driving circuit may include a power source 8, a driving module 13 may be connected to the power source 8. The driving module 13 may be connected to the three-phase brushless motor 7 for driving the three-phase brushless motor 7 to rotate. The driving module 13 may include a first high-power semiconductor module 10 and a second high-power semiconductor module 11, wherein at least three high-power semiconductor components 1, 3, 5 are provided on the first high-power semiconductor module 10, and at least another three high-power semiconductor components 2, 4, 6 are provided on the second high-power semiconductor module 11. The high-power semiconductor components 1-6 may be metal-oxide-semiconductor field-effect transistors (MOSFETs) or any other semiconductor switching devices. When the high-power semiconductor components 1-6 are running, they will generate a lot of heat. If the heat is not dissipated in time, it will lead to failure of the high-power semiconductor components 1-6 due to overheating. The assembly structure of high-power semiconductors and heat sink of the present patent application can be a good solution to this problem. The implementation of the assembly structure of high-power semiconductors and heat sink of the present patent application will be described in detail below.

Figure 2:
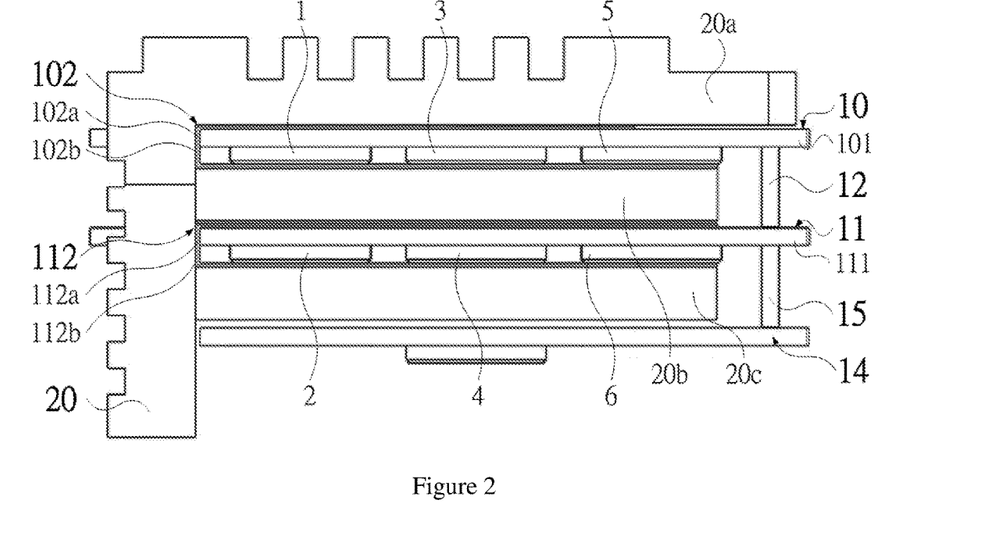
FIG. 2 is an illustrative diagram of a first embodiment of the assembly structure of high-power semiconductors and heat sink of the present patent application.
Figure 3:
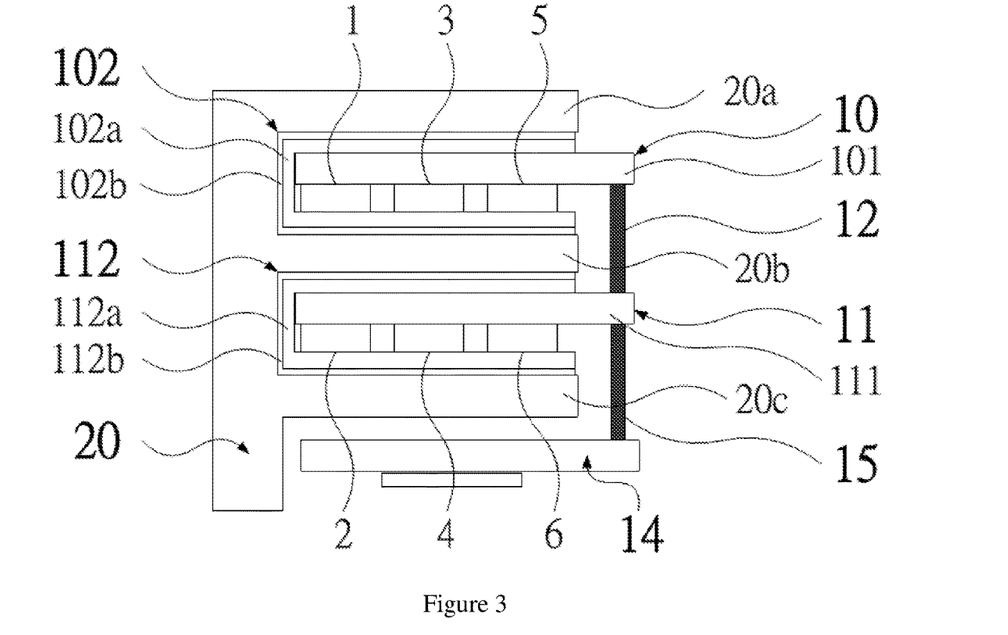
FIG. 3 is a diagram showing the principle of the assembly structure of high-power semiconductors and heat sink shown in FIG. 2.
Figure 4:
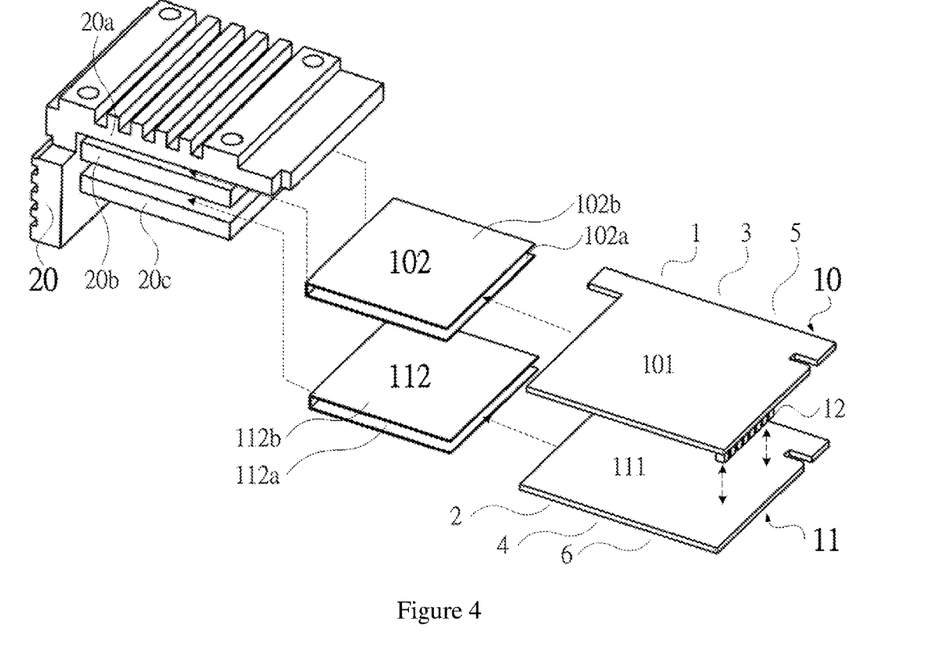
FIG. 4 is an exploded view of the assembly structure of high-power semiconductors and heat sink shown in FIG. 2.
Figure 5:
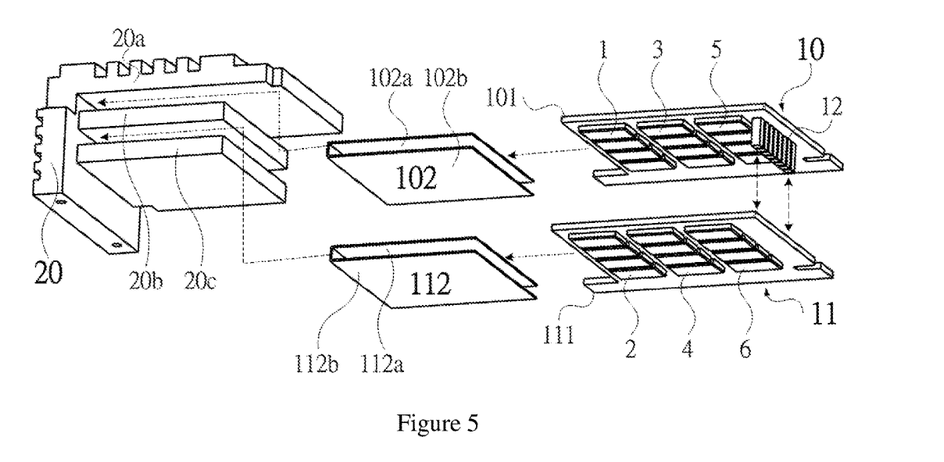
FIG. 5 is an exploded view from another angle of the high-power semiconductor and heat sink assembly structure shown in FIG. 2.
Figure 6:
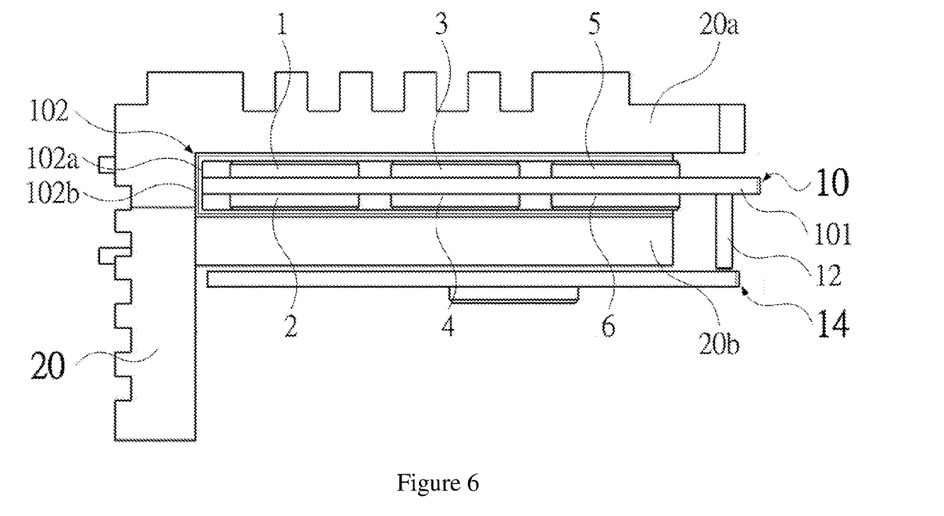
FIG. 6 is an illustrative diagram of a second embodiment of the assembly structure of high-power semiconductors and heat sink of the present patent application.
Figure 7:
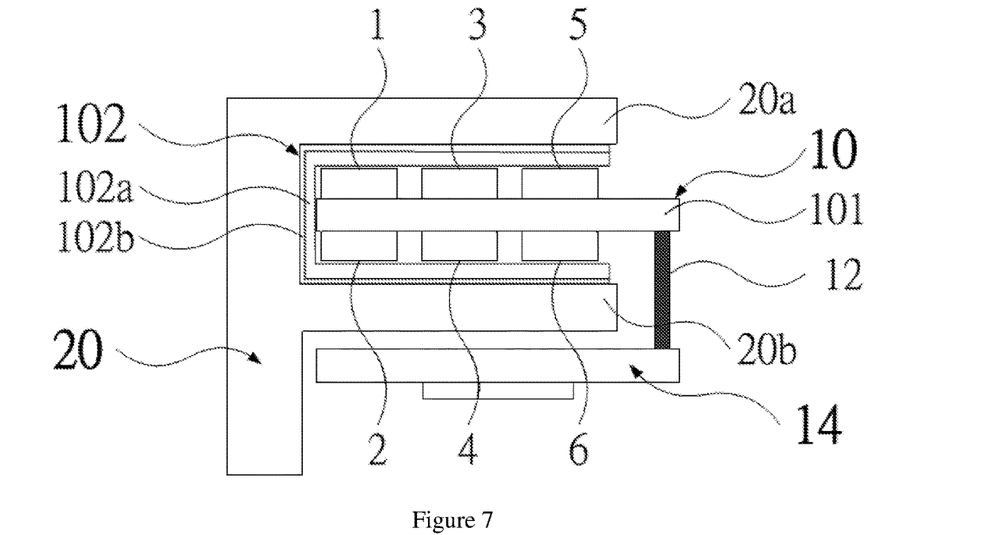
FIG. 7 is a diagram showing the principle of the assembly structure of high-power semiconductors and heat sink shown in FIG. 6.
Figure 8:
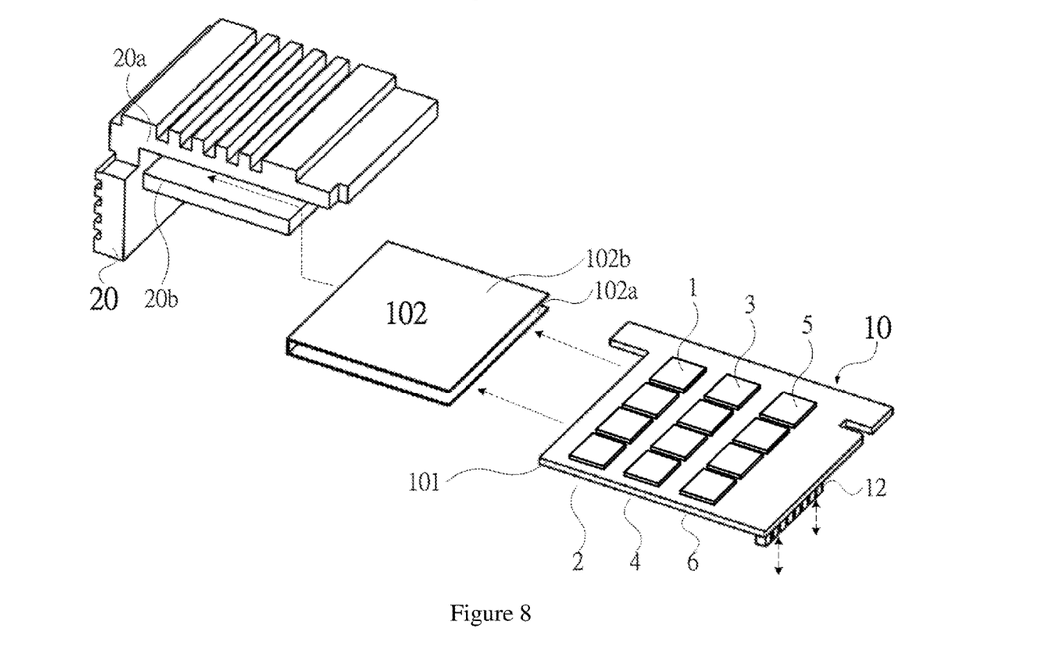
FIG. 8 is an exploded view of the assembly structure of high-power semiconductors and heat sink shown in FIG. 6.
Figure 9:
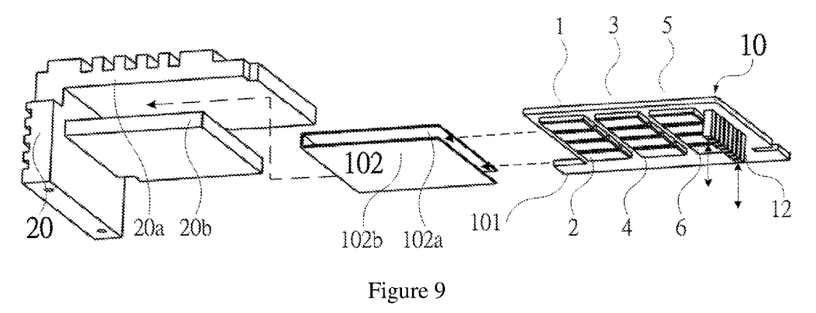
FIG. 9 is an exploded view from another angle of the high-power semiconductor and heat sink assembly structure shown in FIG. 6.

FIGS. 2 and 3 are illustrative diagrams of the first embodiment of the assembly structure of high-power semiconductors and heat sink of the present patent application. A heat sink 20 may have three primary heat-dissipating fins 20a, 20b, 20c. Accommodating space can be formed between two heat-dissipating fins 20a, 20b for accommodating therein a first high-power semiconductor module 10. A printed circuit board 101 with high-power semiconductor components 1, 3, 5 surface-mounted on a first surface thereof, and a gap-filling layer 102 can be inserted into the accommodating space. Accommodating space can be formed between two heat-dissipating fins 20b, 20c for accommodating therein a second high-power semiconductor module 11. A printed circuit board 111 with high-power semiconductor components 2, 4, 6 surface-mounted on a first surface thereof, and a gap-filling layer 112 can be inserted into the accommodating space.

Referring to FIGS. 2 to 5, in order to achieve better heat dissipation, gap-filling layers 102, 112 may be provided between the printed circuit boards 101, 111 and the primary heat-dissipating fins 20a, 20b, 20c. The gap-filling layers 102, 112 may be made of a heat-conductive material. The gap-filling layer 102 can be used to fill the gap between the first high-power semiconductor module 10 and the two primary heat-dissipating fins 20a, 20b. The gap-filling layer 112 can be used to fill the gap between the second high-power semiconductor module 11 and the two primary heat-dissipating fins 20b, 20c. For better heat dissipation and assembly, the gap-filling layers 102, 112 may have a double-layer structure. The gap-filling layer 102 may include a first layer 102a and a second layer 102b which may be disposed one on top of the other. The second layer 102b may be disposed on an outer surface of the first layer 102a, and can be tightly fitted on the surfaces of the two primary heat-dissipating fins 20a, 20b. The gap-filling layer 112 may include a first layer 112a and a second layer 112b which may be disposed one on top of the other. The second layer 112b may be disposed on an outer surface of the first layer 112a, and can be tightly fitted on the surfaces of the two primary heat-dissipating fins 20b, 20c. The first layers 102a, 112a and the second layers 102b, 112b of the two gap-filling layers 102, 112 are made of a heat-conductive, electrically insulating and heat resistant material. The two first layers 102a, 112a may be flexible and may have a surface with viscosity. The two first layers 102a, 112a can fill the gaps very well and can be fitted on the surfaces of the printed circuit boards 101, 111 and the high-power semiconductor components 1-6. The two first layers 102a, 112a can also play the role of a buffer. The two second layers 102b, 112b may be firm and may have surfaces without viscosity. The friction coefficient of the second layers 102b, 112b may be smaller than the friction coefficient of the first layers 102a, 112a, so that one can easily slide and insert the high-power semiconductor modules 10, 11 into the accommodating space between the primary heat-dissipating fins 20a, 20b, 20c. The first layers 102a, 112a may be made of silicone elastomer or other suitable material. The second layers 102b, 112b can be pads of polyethylene terephthalate media, or the second layers 102b, 112b may be made of carbon-filled glass fibers, carbon-filled polyimide, silicone elastomer, polyimide coated with silicone rubber, or other suitable material.

Referring to FIGS. 2 to 5, in the present embodiment, the first surface of the printed circuit board 101 can be surface-mounted with the high-power semiconductor components 1, 3, 5. The high-power semiconductor components 1, 3, 5 can be tightly fitted on the first layer 102a of the gap-filling layer 102. The second surface of the printed circuit board 101 can be tightly fitted on the first layer 102a of the gap-filling layer 102. This can ensure that the printed circuit board 101 and the high-power semiconductor components 1, 3, 5 thereon can maintain good contact with the gap-filling layer 102, so that heat can quickly and timely conducted from the printed circuit board 101 and the high-power semiconductor components 1, 3, 5 to the heat sink 20. The heat-dissipating structure of the printed circuit board 111 and the high-power semiconductor components 2, 4, 6 can be the same as the heat-dissipating structure of the printed circuit board 101 and the high-power semiconductor components 1, 3, 5, and will not be repeated here. In the present embodiment, the driving circuit may further include a third circuit module 14. The first high-power semiconductor module 10 may be connected with the second high-power semiconductor module 11 through a connector 12. The second high-power semiconductor module 11 may be connected with the third circuit module 14 through a connector 15.

FIGS. 6-9 are illustrative diagrams of the second embodiment of the assembly structure of high-power semiconductors and heat sink of the present patent application. The heat sink 20 may have two primary heat-dissipating fins 20a, 20b. Accommodating space can be formed between the two heat-dissipating fins 20a, 20b. A printed circuit board 101, high-power semiconductor components 1, 3, 5 surface-mounted on a first surface thereof, high-power semiconductor components 2, 4, 6 surface-mounted on a second surface thereof, and a gap-filling layer 102 can be inserted into the accommodating space.

Referring to FIGS. 6-9, in order to achieve better heat dissipation, a gap-filling layer 102 may be provided between the printed circuit board 101 and the two primary heat-dissipating fins 20a, 20b. The gap-filling layer 102 may be made of a heat-conductive material. The gap-filling layer 102 can be used to fill the gap between the high-power semiconductor module 10 and the two primary heat-dissipating fins 20a, 20b. For better heat dissipation and assembly, the gap-filling layer 102 may have a double-layer structure. The gap-filling layer 102 may include a first layer 102a and a second layer 102b which may be disposed one on top of the other. The second layer 102b may be disposed on an outer surface of the first layer 102a, and can be tightly fitted on the surfaces of the two primary heat-dissipating fins 20a, 20b. The first layer 102a and the second layer 102b of the gap-filling layer 102 may be made of a heat-conductive, electrically insulating and heat resistant material. The first layer 102a may be flexible and may have a surface with viscosity. The first layer 102a can fill the gap very well and can be fitted on the surface of the printed circuit board 101 and the high-power semiconductor components 1-6. The first layer 102a can also play the role of a buffer. The two second layer 102b may be firm and may have surfaces without viscosity. The friction coefficient of the second layer 102b may be smaller than the friction coefficient of the first layer 102a, so that one can easily slide and insert the printed circuit board 101 into the accommodating space between the primary heat-dissipating fins 20a, 20b. The first layer 102a may be made of silicone elastomer or other suitable material. The second layer 102b can be pads of polyethylene terephthalate media, or the second layer 102b may be made of carbon-filled glass fibers, carbon-filled polyimide, silicone elastomer, polyimide coated with silicone rubber, or other suitable material.

Referring to FIGS. 6-9, in the present embodiment, both surfaces of the printed circuit board 101 can be surface-mounted with the high-power semiconductor components. The first surface of the printed circuit board 101 can be surface-mounted with the high-power semiconductor components 1, 3, 5. The second surface of the printed circuit board 101 can be surface-mounted with the high-power semiconductor components 2, 4, 6. The high-power semiconductor components 1-6 can be tightly fitted on the first layer 102a of the gap-filling layer 102. This can ensure that the printed circuit board 101 and the high-power semiconductor components 1-6 thereon can maintain good contact with the gap-filling layer 102, so that heat can quickly and timely conducted from the printed circuit board 101 and the high-power semiconductor components 1-6 to the heat sink 20. In the present embodiment, the driving circuit may further include a third circuit module 14. The high-power semiconductor module 10 may be connected with the third circuit module 14 through a connector 12.

Figure 10:
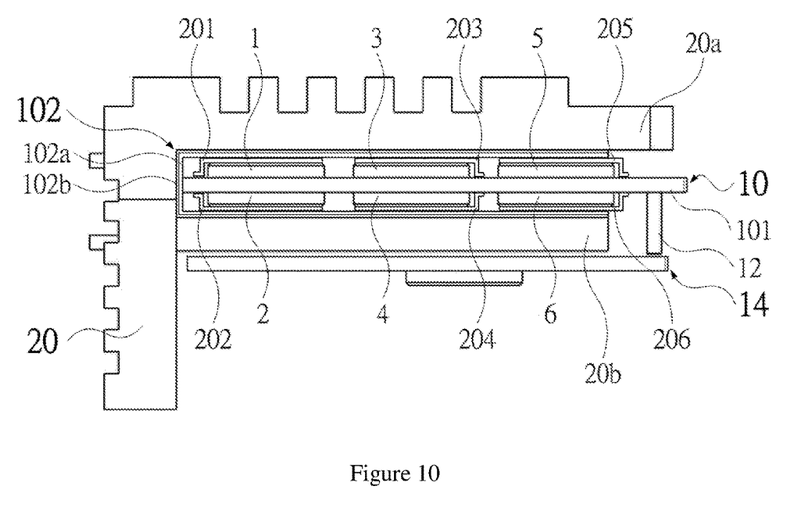
FIG. 10 is an illustrative diagram of a third embodiment of the assembly structure of high-power semiconductors and heat sink of the present patent application.
Figure 11:
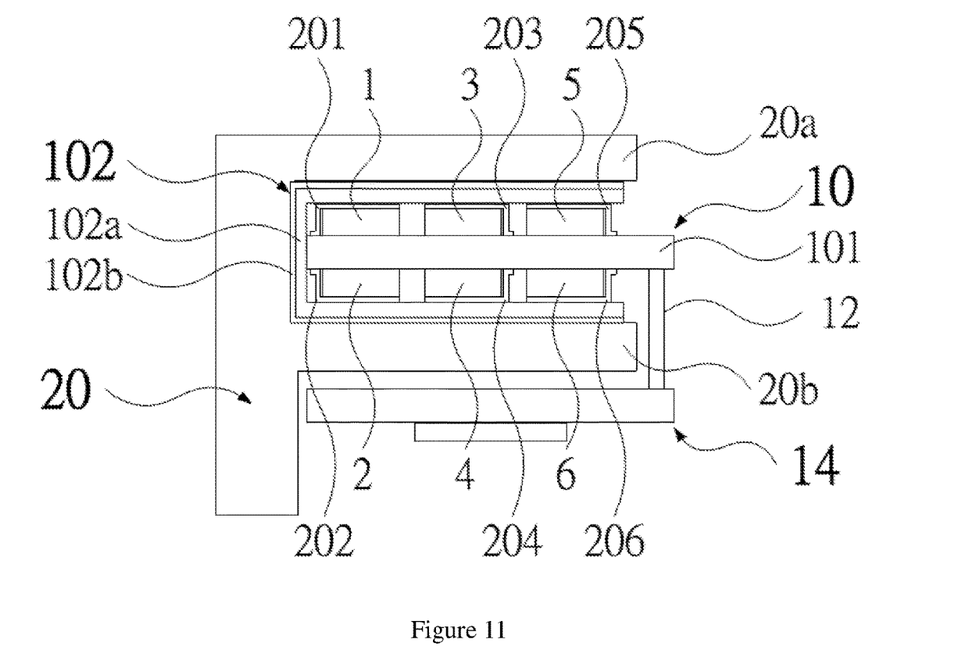
FIG. 11 is a diagram showing the principle of the assembly structure of high-power semiconductors and heat sink shown in FIG. 10.

FIGS. 10 and 11 are illustrative diagrams of the third embodiment of the assembly structure of high-power semiconductors and heat sink of the present patent application. It is a further improvement based on the second embodiment. For better heat dissipation, the high-power semiconductor components 1, 3, 5 on the first surface of the printed circuit board 101 of the high-power semiconductor module 10 may be provided with heat-conductive metal plates 201, 203, 205 respectively. The conductive metal plates 201, 203, 205 can be horizontally fixed on top portions of packaging of the high-power semiconductor components 1, 3, 5. The heat-conductive metal plates 201, 203, 205 can be electrically connected to the large current-flowing pins, e.g. MOSFET Drain pins, of the high-power semiconductor components 1, 3, 5 by manual soldering or by surface mounting technology. The high-power semiconductor components 2, 4, 6 on the second surface of the printed circuit board 101 are provided with conductive metal plates 202, 204, 206 respectively. The conductive metal plates 202, 204, 206 can be horizontally fixed on top portions of packaging of the high-power semiconductor components 2, 4, 6. The heat-conductive metal plates 202, 204, 206 can be electrically connected to the large current-flowing pins, e.g. MOSFET Drain pins, of the high-power semiconductor components 2, 4, 6 by manual soldering or by surface mounting technology. The heat-conductive metal plates 201-206 may be plates made of copper, aluminum or an alloy. Since the heat-conductive metal plates 201-206 are connected to the large current-flowing pins of the high-power semiconductor components 1-6 respectively, heat generated by the large current-flowing pins can be timely conducted to the primary heat-dissipating fins 20a, 20b of the heat sink 20. Thus, a better heat-dissipating effect can be obtained. Other structures of this embodiment are the same as those of the second embodiment, and will not be repeated here.

In the present patent application, the high-power semiconductor components can be mounted on the printed circuit board by surface mounting technology (SMT). They can also be mounted on the printed circuit board by soldering. The heat sink can be formed by processing a piece of metal, such as aluminum alloy, aluminum, copper alloy, copper, etc. A piece of metal can be used to produce the heat sink by extrusion or through computerized numeral control (CNC) or other processing methods. The heat sink can also be made from more than one piece of metal by welding or assembling by screw-fastening.

In the present patent application, since the printed circuit boards with the surface-mounted high-power semiconductor components are disposed in the accommodating space formed between the primary heat-dissipating fins of the heat sink, and gap-filling layers are provided between the printed circuit boards and the primary heat-dissipating fins, heat generated by the high-power semiconductor components and the printed circuit boards can be quickly conducted to the heat-dissipating fins of the heat sink and can be spread out quickly through the primary heat-dissipating fins.

Specific embodiments have been described above with reference to the accompanying drawings. However, the present application is not limited to the above specific embodiments. The above specific embodiments are merely illustrative and should not be considered as limiting. It should be noted that, upon reading the above disclosure, a person skilled in the art can make various other changes or modifications without departing from the scope of the appended claims.

What is claimed is:

1. An assembly structure of high-power semiconductors and heat sink, comprising: a first high-power semiconductor module, the first high-power semiconductor module comprising a first printed circuit board, and a first plurality of high-power semiconductor components provided on a first surface of the first printed circuit board; a second high-power semiconductor module, the second high-power semiconductor module comprising a second printed circuit board, and a second plurality of high-power semiconductor components provided on a first surface of the second printed circuit board; a heat sink comprising at least three primary heat-dissipating fins, the first high-power semiconductor module and the second high-power semiconductor modules are disposed between two adjacent primary heat-dissipating fins respectively; and a plurality of gap-filling layers, the gap-filling layers are provided between the first high-power semiconductor module and the primary heat-dissipating fins, as well as between the second high-power semiconductor module and the primary heat-dissipating fins, the gap-filling layers being tightly fitted on surfaces of the primary heat-dissipating fins; wherein a plurality of heat-conductive metal plates are horizontally fixed on a side portion and the entire top portion of each packaging's of the high-power semiconductor components, the heat-conductive metal plates being electrically connected with large current-flowing pins of the high-power semiconductor components.

2. The assembly structure of high-power semiconductors and heat sink as claimed in claim 1, wherein the first and second pluralities of high-power semiconductor components are surface mount semiconductors.

3. The assembly structure of high-power semiconductors and heat sink as claimed in claim 1, wherein the first and second pluralities of high-power semiconductor components are mounted on the first and second printed circuit boards by means of surface mounting technology.

4. The assembly structure of high-power semiconductors and heat sink as claimed in claim 2, wherein each printed circuit board is provided with at least one connector or connecting aperture for electrical connection.

5. The assembly structure of high-power semiconductors and heat sink as claimed in claim 3, wherein each printed circuit board is provided with at least one connector or connecting aperture for electrical connection.

6. The assembly structure of high-power semiconductors and heat sink as claimed in claim 1, wherein the gap-filling layers possess heat conductivity and flexibility.

7. The assembly structure of high-power semiconductors and heat sink as claimed in claim 1, wherein the gap-filling layers cover the first high-power semiconductor module and the second power semiconductor modules respectively.

8. The assembly structure of high-power semiconductors and heat sink as claimed in claim 1, wherein the heat sink is made from a piece of metal, or a combination of two or more pieces of metal.

9. An assembly structure of high-power semiconductors and heat sink, comprising: a high-power semiconductor module, the high-power semiconductor module comprising a printed circuit board, and first and second pluralities of high-power semiconductor components provided on first and second surfaces of the printed circuit board respectively; a heat sink comprising at least two primary heat-dissipating fins, the high-power semiconductor module is disposed between two adjacent primary heat-dissipating fins; and a gap-filling layer, the gap-filling layer being provided between the high-power semiconductor module and the primary heat-dissipating fins, and the gap-filling layer being tightly fitted on surfaces of the primary heat-dissipating fins; wherein a plurality of heat-conductive metal platesare horizontally fixed on a side portion and the entire top portion of each packaging's of the high-power semiconductor components, the heat-conductive metal plates being electrically connected with large current-flowing pins of the high power semiconductor components.

10. The assembly structure of high-power semiconductors and heat sink as claimed in claim 9, wherein the first and second pluralities of high-power semiconductor components are surface mount semiconductors.

11. The assembly structure of high-power semiconductors and heat sink as claimed in claim 9, wherein the first and second pluralities of high-power semiconductor components are mounted on the printed circuit board by means of surface mounting technology.

12. The assembly structure of high-power semiconductors and heat sink as claimed in claim 9, wherein the printed circuit board is provided with at least one connector or connecting aperture for electrical connection.

13. The assembly structure of high-power semiconductors and heat sink as claimed in claim 9, wherein the gap-filling layer possesses heat conductivity and flexibility.

14. The assembly structure of high-power semiconductors and heat sink as claimed in claim 9, wherein the heat sink is made from a piece of metal, or a combination of two or more pieces of metal.

* * * * *